(12) United States Patent
Ayres et al.

(10) Patent No.: US 6,302,781 B1
(45) Date of Patent: Oct. 16, 2001

(54) FAN-MOUNTING FACEPLATE FOR A CHASSIS AND METHODS OF MANUFACTURE AND ASSEMBLY THEREFOR

(76) Inventors: John W. Ayres, 12118 Golden Meadow La., Forney, TX (US) 75126; Vincent M. Byrne, 2304 Homestead Dr., Mesquite, TX (US) 75181; Edward C. Fontana, 319 Columbia Dr., Rockwall, TX (US) 75087; Steven C. Stein, 9316 Forrestridge Dr., Dallas, TX (US) 75238

( * ) Notice: Subject to any disclaimer, the term of this patent is extended or adjusted under 35 U.S.C. 154(b) by 0 days.

(21) Appl. No.: 09/327,235

(22) Filed: Jun. 7, 1999

(51) Int. Cl.[7] .................................................. H05K 7/20
(52) U.S. Cl. ............................................ 454/184; 361/695
(58) Field of Search ............................. 454/184; 361/695

(56) References Cited

U.S. PATENT DOCUMENTS

| | | | |
|---|---|---|---|
| 4,517,880 | * | 5/1985 | Buckner et al. ...................... 454/184 |
| 5,707,282 | * | 1/1998 | Clements et al. .................... 454/184 |
| 5,713,790 | * | 2/1998 | Lin ........................................ 454/184 |
| 5,788,566 | * | 8/1998 | McAnally et al. ................... 454/184 |
| 5,927,386 | * | 7/1999 | Lin .................................. 454/184 X |
| 6,075,698 | * | 6/2000 | Hogan et al. ........................ 361/695 |

* cited by examiner

Primary Examiner—Harold Joyce

(57) ABSTRACT

A faceplate for a chassis composed of a moldable material and various methods of fabricating and assembling the faceplate into a fan-cooled electronics enclosure. In one embodiment, the faceplate includes: (1) a chassis mount adapted to cooperate with a corresponding first faceplate mount on the chassis to register the faceplate with respect to the chassis, (2) a fan mount adapted to cooperate with a corresponding second faceplate mount on a fan to register the faceplate with respect to the chassis and (3) a grille proximate the fan mount, the chassis mount and the fan mount cooperating to affix the fan to the chassis when the faceplate is mounted to the chassis.

18 Claims, 4 Drawing Sheets

FAN-MOUNTING FACEPLATE FOR A CHASSIS AND METHODS OF MANUFACTURE AND ASSEMBLY THEREFOR

TECHNICAL FIELD OF THE INVENTION

The present invention is directed, in general, to cooling for electronics and, more specifically, to a fan-mounting faceplate for a chassis and methods of manufacturing and assembling the same into a fan-cooled electronics enclosure.

BACKGROUND OF THE INVENTION

One or more DC cooling fans are often employed in power conversion systems to remove heat generated by electronic devices. Cooling fans play an important role in overall system reliability and lifetime.

In most power conversion applications, commercially available cooling fans (e.g., the Beta V, manufactured by Nidec America Corporation of Torrington, Conn.) are included in chassis or power conversion modules manufactured by original equipment manufacturers (OEMs) The fan is often a square box fan with mounting holes located in the four corners of the box. The fan is equipped with an electrical pigtail to accomplish the necessary electrical interconnection to the power conversion module. Typical fan mounting methods involve four machine screws with an equal number of hexagonal nuts ("hex-nuts"), and perhaps lock washers, holding the fan to the frame or cabinet of the power conversion module. Thus to hold a single fan in place, eight, and possibly twelve, hardware parts are required. Often, the required service life of the electronic equipment is greater than the service life of the fan, so field fan replacement is part of routine maintenance. Of course, physical installation of the fan involves properly locating the fan housing in relation to the power conversion module cabinet or chassis, and manually routing the machine screws through mount holes in the fan housing and matching holes in the chassis cabinet. Lock washers must then be placed on the exposed machine screws and the hex-nuts threaded on the machine screws. The installer must then tighten the hex-nuts in place, usually with a screwdriver and a nut driver. As a consequence, multiple parts are required to install a single fan unit, in addition to the labor required to install, align and tighten the machine screws and nuts. When considering applications such as the telecommunications industry, where hundreds of thousands of fans are required to cool power conversion units, the total part count required and cost is obviously very significant.

Accordingly, what is needed in the art is a simpler method of securely mounting a cooling fan in a power conversion cabinet that minimizes part count and installation labor.

SUMMARY OF THE INVENTION

To address the above-discussed deficiencies of the prior art, the present invention provides a faceplate for a chassis composed of a moldable material (which may be metal) and various methods of fabricating and assembling the faceplate into a fan-cooled electronics enclosure. In one embodiment, the faceplate includes: (1) a chassis mount adapted to cooperate with a corresponding first faceplate mount on the chassis to register the faceplate with respect to the chassis, (2) a fan mount adapted to cooperate with a corresponding second faceplate mount on a fan (which, in an embodiment to be illustrated and described, is a box fan) to register the faceplate with respect to the chassis and (3) a grille proximate the fan mount, the chassis mount and the fan mount cooperating to affix the fan to the chassis when the faceplate is mounted to the chassis.

The present invention therefore introduces the broad concept of molding a fan mount into the faceplate of an electronics enclosure thereby to avoid the need to provide a separate, typically multi part, fan mount.

In one embodiment of the present invention, the fan mount comprises a plurality of posts and the second faceplate mount comprises a corresponding plurality of recesses in a housing of the fan. In an embodiment to be illustrated and described, the fan mount comprises a plurality of posts. The chassis mount and the fan mount cooperate to affix the fan to the chassis only when the faceplate is mounted to the chassis. Thus, in this embodiment, the posts merely register the fan with respect to the faceplate; they to not secure the fan to the faceplate. The fan is secured when the faceplate is joined to the chassis. Of course, some applications may benefit from a fan mount that includes positive retention features, such as snaps, or plastic features, etc., that can secure the fan to the faceplate.

In one embodiment of the present invention, the fan mount includes a keying feature that cooperates with a feature on the fan to orient the fan with respect to the faceplate. The keying feature can be employed further to ensure that the airflow generated by the fan is oriented correctly. of course, the key is not necessary to the present invention.

In one embodiment of the present invention, the grille is composed of the moldable material and is integral with the faceplate. In an embodiment to be illustrated and described, the grille comprises a plurality of vanes that advantageously present minimal interference to airflow and a barrier to manual fan blade contact. Of course, the grille may be a separate piece and is not, in fact, necessary to the present invention.

In one embodiment of the present invention, a handle is hingedly coupled to the faceplate to allow the handle to be deployed and stowed. The handle, while not necessary to the present invention, is advantageous when the electronics enclosure forms a module designed to be inserted into, and removed from, an electronics rack. The handle, if provided, may alternatively be fixed with respect to the faceplate.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
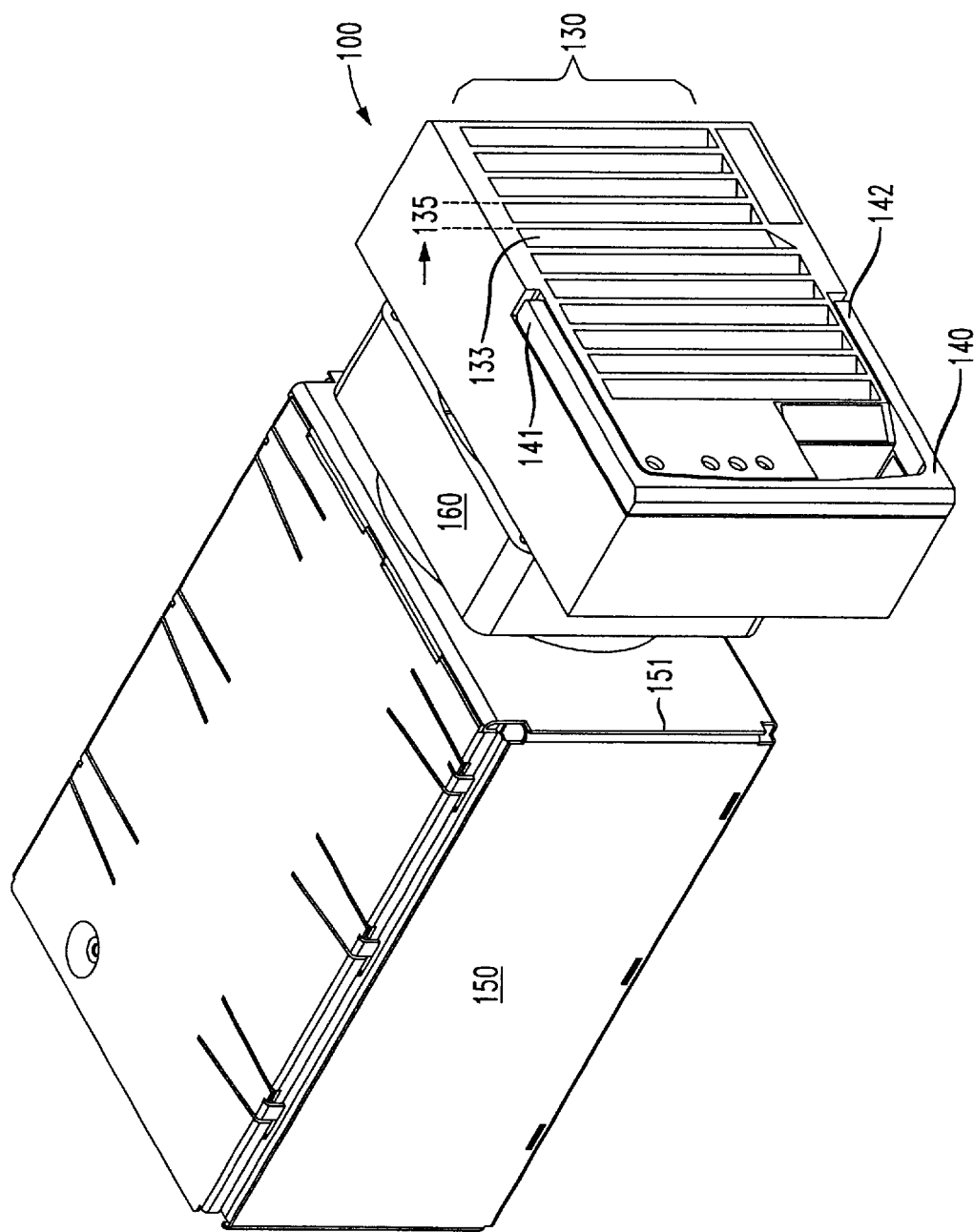
FIG. 1A illustrates a front exploded isometric view of one embodiment of an electronics chassis having a fan and a fan-mounting faceplate constructed according to the principles of the present invention.
Figure 1B:
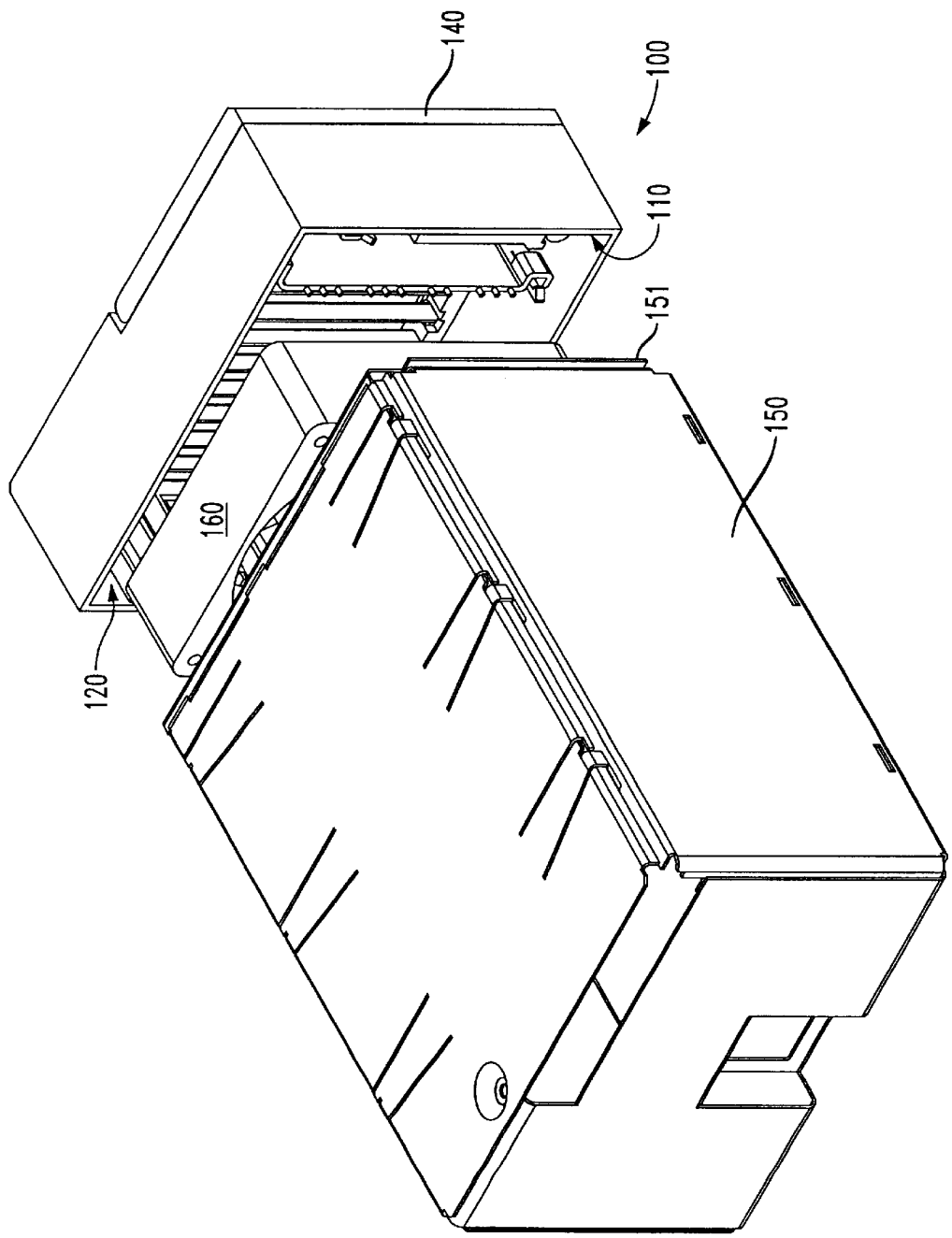
FIG. 1B illustrates a rear exploded isometric view of the electronics chassis, fan, and fan-mounting faceplate of FIG. 1A.

Referring initially to FIGS. 1A and 1B, illustrated are front and rear exploded isometric views, respectively, of one embodiment of a fan assembly for use with an electronic chassis comprising an electronics chassis, a fan, and a fan-mounting faceplate constructed according to the principles of the present invention. Included in the fan assembly is a fan-mounting faceplate, generally designated 100, which comprises a chassis mount 110, a fan mount bay 120, a grille 130, and a retractable handle 140. In the illustrated embodiment, the chassis mount 10 cooperates with a first faceplate mount 151 on an electronics chassis 150 to mount the faceplate 100 to the chassis 150. A box fan 160 is shown in proper relation to the chassis 150 and faceplate 100 prior to assembly.

The grille 130, pictured on an exterior side (not separately designated) of the faceplate 100, may be integrally molded with the faceplate 100 and may comprise a plurality of vanes 133 proximate the fan mount bay 120. The vanes 133 are positioned apart by a distance 135 so as to prevent foreign objects of a particular size, e.g., human digits, from being intentionally or accidentally inserted into the fan 160. The vanes 133 may also be aerodynamically shaped for optimal airflow for cooling electronics (not visible) within the chassis 150. The retractable handle 140, also shown on the exterior side of the faceplate 100, is hinged at points 141, 142 so that the handle 140 may be selectively deployed (not shown) or stowed (as shown).

In a preferred embodiment, the faceplate 100 is composed of a moldable material such as plastic. Thus, the chassis mount 110, fan mount bay 120, and grille 130 may be readily formed in a single molding operation while providing proper tolerances to accept the fan 160 and mate with the electronics chassis 150.

Figure 2:
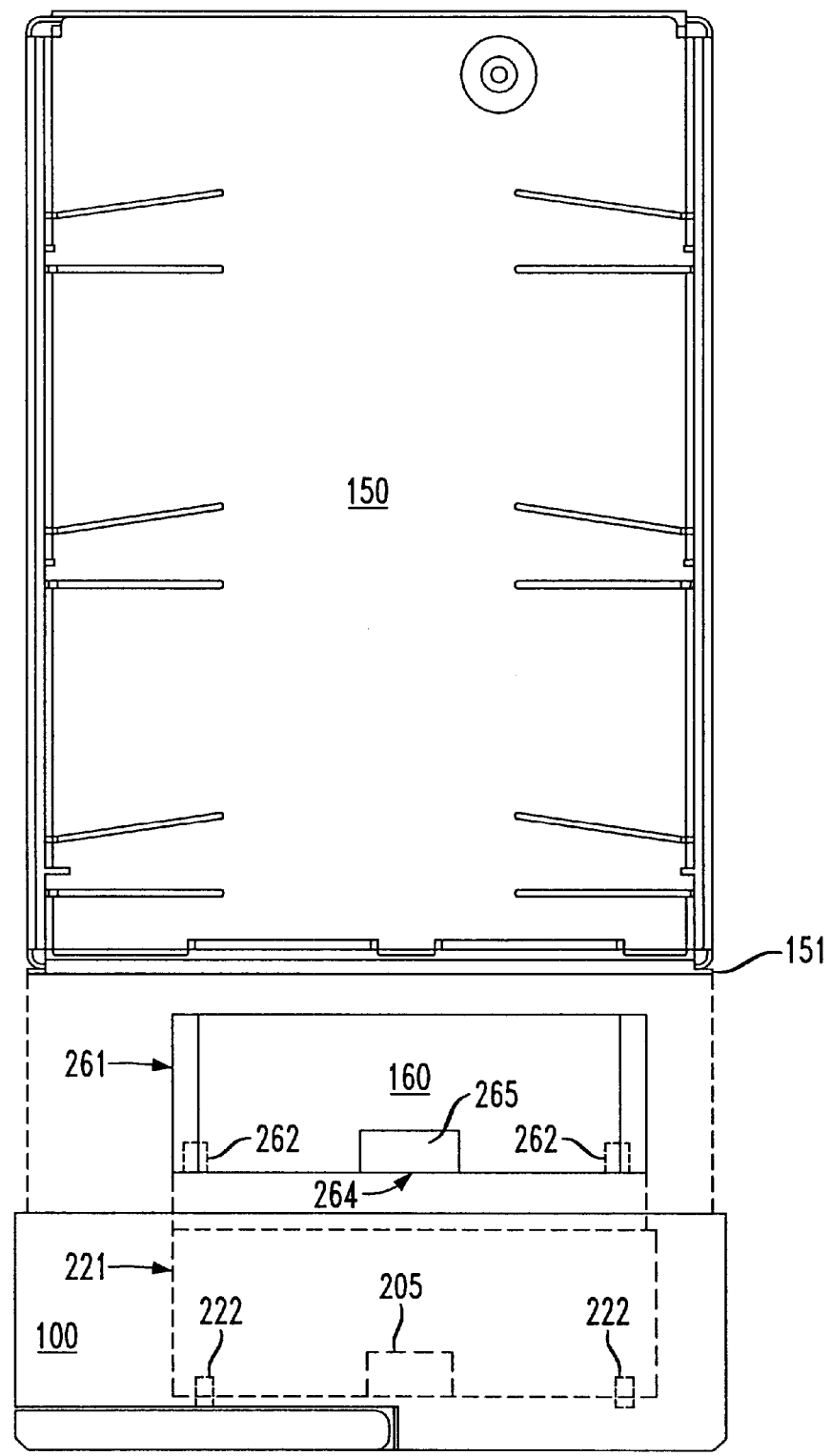
FIG. 2 illustrates an exploded plan view of the fan-mounting faceplate and electronics chassis of FIG. 1.

Referring now to FIG. 2, illustrated is an exploded plan view of the fan-mounting faceplate and electronics chassis of FIG. 1. In one embodiment, the fan mount bay 120 may comprise an opening 221 sized to receive the fan 160 closely. In this configuration, the opening 221 cooperates with a second faceplate mount, which in the illustrated embodiment is shown as a periphery 261 of the fan 160, to position the fan 160 in relation to the faceplate 100. As illustrated in FIG. 2, the fan mount bay 120 is located on an interior side (not separately designated) of the faceplate 100; thus, the fan 160 is received on the interior side of the faceplate 100 when the faceplate 100 is mounted to the chassis 150. A preferred embodiment of the fan mount bay 120 is also shown that includes a plurality of posts 222. The posts 222 cooperate with a corresponding plurality of recesses 262 in a face 264 of the fan 160 to align the fan 160 to the faceplate 100. It should be noted that the principle purpose of the opening 221 or the posts 222 is to position the fan 160 in the desired location within the interior side of the faceplate 100 for mounting to the chassis 150. Thus, the fan mount bay 120, in either form, positions the fan 160 with respect to the faceplate 100; the chassis mount 110 and first faceplate mount 151 align and affix the fan 160 and faceplate 100 to the chassis 150. Also shown in FIG. 2 is a keying feature 205 located in the fan mount bay 120 that is configured to cooperate with a corresponding slot feature 265 on the fan 160, assuring that the fan 160 is installed in the faceplate 100 in the correct orientation. More specifically, the keying feature 205 and the slot feature 265 cooperate to orient a blowing direction of the fan 160 with respect to the faceplate, as is illustrated in FIG. 2.

Figure 3:
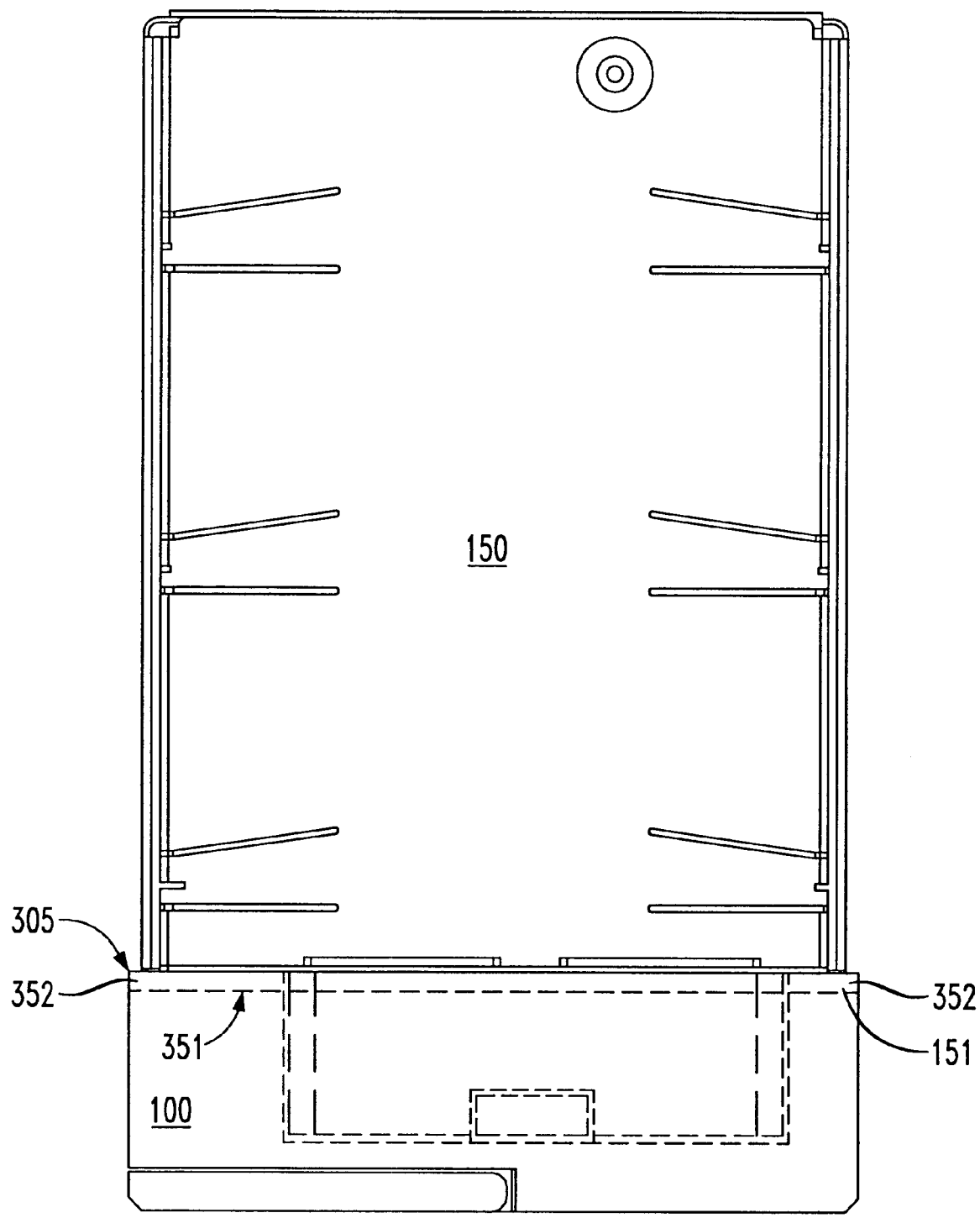
FIG. 3 illustrates a plan view of the fan-mounting faceplate and electronics chassis of FIG. 2 as assembled.

Referring now to FIG. 3, illustrated is a plan view of the fan-mounting faceplate 100 and electronics chassis 150 of FIG. 2 as assembled. It should be observed that the embodiment described above does not require machine screws or any other type of mechanical fasteners to affix the faceplate 100 to the chassis 150, as distinguished from the prior art. One skilled in the pertinent art should observe that the faceplate 100 may be removably fastened to the chassis 150 in a variety of ways. Two such ways (neither illustrated) are: plastic posts on the faceplate 100 cooperating with spring steel apertures, such as found in a Palnutg, in a face 351 of the chassis 150, or the faceplate 100 may be made of a slightly flexible plastic having internal projections 352 so that edges 305 of the faceplate 100 cooperatively engage the first faceplate mount 151. It should be clear that the method of attaching the faceplate 100 to the chassis 150 may be by any suitable means and still remain within the scope and intent of the present invention.

One skilled in the pertinent art will recognize that the faceplate 100 automatically aligns and orients the fan 160 with the faceplate 100 on the interior side of the faceplate 100, and subsequently aligns and orients the fan 160 with the chassis 150, when the faceplate 100 and fan 160 are installed without additional fasteners. Thus, even a minimally skilled technician may remove and replace a faulty fan 160 without major dismantling of the electronics chassis 150. As field replacement of fans may be part of routine maintenance, the present invention minimizes replacement cost and labor over the prior art.

From the above, it is apparent that the present invention provides a faceplate for a chassis composed of a moldable material and various methods of fabricating and assembling the faceplate into a fan-cooled electronics enclosure. In one embodiment, the faceplate includes: (1) a chassis mount adapted to cooperate with a corresponding first faceplate mount on the chassis to register the faceplate with respect to the chassis, (2) a fan mount adapted to cooperate with a corresponding second faceplate mount on a box fan to register the faceplate with respect to the chassis and (3) a grille proximate the fan mount, the chassis mount and the fan mount cooperating to affix the fan to the chassis when the faceplate is mounted to the chassis.

Although the present invention has been described in detail, those skilled in the art should understand that they can make various changes, substitutions and alterations herein without departing from the spirit and scope of the invention in its broadest form.

What is claimed is:

1. A fan assembly for a chassis comprising:
a faceplate having an interior side and an exterior side and having a fan mount bay formed in said interior side and further including a keying feature located in said fan mount bay, said faceplate further including a chassis mount on said interior side adapted to cooperate with a corresponding faceplate mount on a chassis to register said faceplate with respect to said chassis; and
a fan having a faceplate mount and a slot feature, said slot feature configured to cooperatively engage said keying feature and thereby orient a blowing direction of said fan within said fan mount bay.

2. The fan assembly as recited in claim 1 wherein said fan mount bay further includes a plurality of posts and said faceplate mount of said fan further comprises a corresponding plurality of recesses in said fan.

3. The fan assembly as recited in claim 1 wherein said fan mount bay comprises an opening substantially equal to a perimeter of said fan, said chassis mount and said fan mount bay cooperating to affix said fan to said chassis only when said faceplate is mounted to said chassis.

4. The fan assembly as recited in claim 1 wherein said fan assembly further includes a grille composed of moldable material integral with said faceplate.

5. The fan assembly as recited in claim 4 wherein said grille comprises a plurality of vanes.

6. The fan assembly as recited in claim 1 wherein a handle is hingedly coupled to said faceplate to allow said handle to be deployed and stowed.

7. A method of manufacturing a fan assembly for a chassis, comprising:

molding a faceplate, said faceplate having an interior side and an exterior side and having a fan mount bay formed in said interior side and further including a keying feature located in said fan mount bay;

forming a chassis mount in said interior side of said faceplate adapted to cooperate with a corresponding faceplate mount on a chassis to register said faceplate with respect to said chassis; and providing a fan having a faceplate mount and a slot feature, said slot feature configured to cooperatively engage said keying feature and thereby orient a blowing direction of said fan within said fan mount bay.

8. The method as recited in claim 7 wherein said molding said faceplate further includes molding a plurality of posts therein, and said faceplate mount of said fan comprises a corresponding plurality of recesses in said fan.

9. The method as recited in claim 7 wherein said molding said faceplate comprises molding an opening substantially equal to a perimeter of said fan, said chassis mount and said fan mount bay cooperating to affix said fan to said chassis only when said faceplate is mounted to said chassis.

10. The method as recited in claim 7 further comprising forming a grille composed of moldable material integral with said faceplate.

11. The method as recited in claim 10 wherein said forming comprises molding a plurality of vanes.

12. The method as recited in claim 7 further comprising hingedly coupling a handle to said faceplate to allow said handle to be deployed and stowed.

13. A method of assembling a fan-cooled electronics enclosure, comprising:

forming a chassis;

molding a fan assembly that includes:

a faceplate having an interior side and an exterior side and having a fan mount bay formed in said interior side and further including a keying feature located in said fan mount bay, said faceplate further including a chassis mount on said interior side adapted to cooperate with a corresponding faceplate mount on said chassis to register said faceplate with respect to said chassis, and a fan having a faceplate mount and a slot feature, said slot feature configured to cooperatively engage said keying feature and thereby orient a blowing direction of said fan within said fan mount bay;

coupling said fan mount bay to said faceplate mount of said fan; and coupling said faceplate mount of said chassis to said chassis mount.

14. The method as recited in claim 13 wherein said fan mount bay further includes a plurality of posts and said faceplate mount of said fan further comprises a corresponding plurality of recesses in said fan.

15. The method as recited in claim 13 wherein said fan mount bay comprises an opening substantially equal to a perimeter of said fan, said chassis mount and said fan mount bay cooperating to affix said fan to said chassis only when said faceplate is mounted to said chassis.

16. The method as recited in claim 13 wherein said fan assembly further includes a grille composed of moldable material integral with said faceplate.

17. The method as recited in claim 16 wherein said grille comprises a plurality of vanes.

18. The method as recited in claim 13 further comprising hingedly coupling a handle to said faceplate to allow said handle to be deployed and stowed.

* * * * *